(12) United States Patent
Newsome

(10) Patent No.: US 9,087,999 B2
(45) Date of Patent: Jul. 21, 2015

(54) METHOD OF FABRICATING AN ELECTRONIC DEVICE COMPRISING ALLOWING A SELF-ASSEMBLED LAYER TO FORM SELECTIVELY

(75) Inventor: Christopher Newsome, St. Ives (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 0 days.

(21) Appl. No.: 14/239,533

(22) PCT Filed: Aug. 9, 2012

(86) PCT No.: PCT/GB2012/000646
§ 371 (c)(1),
(2), (4) Date: Feb. 18, 2014

(87) PCT Pub. No.: WO2013/024238
PCT Pub. Date: Feb. 21, 2013

(65) Prior Publication Data
US 2014/0183516 A1    Jul. 3, 2014

(30) Foreign Application Priority Data

Aug. 18, 2011  (GB) .................................. 1114215.5

(51) Int. Cl.
H01L 51/05      (2006.01)
H01L 51/10      (2006.01)
H01L 51/00      (2006.01)

(52) U.S. Cl.
CPC ........ *H01L 51/0512* (2013.01); *H01L 51/0002* (2013.01); *H01L 51/105* (2013.01); *H01L 51/0541* (2013.01)

(58) Field of Classification Search
USPC .................. 257/40, 72, E51.006; 438/99
See application file for complete search history.

(56) References Cited

U.S. PATENT DOCUMENTS 7,407,849 B2    8/2008   Sirringhaus et al.
2003/0092232 A1* 5/2003  Klauk et al. ............... 438/200
(Continued)

FOREIGN PATENT DOCUMENTS

EP        1 928 038 A2    6/2008
WO    WO-2004/066477 A2    8/2004
(Continued)

OTHER PUBLICATIONS

Anita et al., "Microarc Plasma Treatment of Titanium and Aluminum Surfaces in Electrolytes," *Thin Solid Films*, 506-507:364-368 (2006).
(Continued)

*Primary Examiner* — Yu-Hsi D Sun
*Assistant Examiner* — Charles R Peters
(74) *Attorney, Agent, or Firm* — Marshall, Gerstein & Borun LLP

(57) ABSTRACT

A method of fabricating an electronic device, such as an organic thin film transistor, is disclosed. A substrate, for example a silicate glass substrate, has a surface which supports at least one metallic electrode comprising at least one metal, for example gold, and at least a portion of the surface of the substrate is exposed. The method comprises selectively forming a self-assembled layer on the exposed portion of the substrate surface such that no self-assembled layer is formed on the at least one metallic electrode and applying a solution or other liquid which is repelled by the self-assembled layer to at least one metal electrode so as to selectively form a layer of further material, such as a charge injection promoting material, on the at least one metallic electrode.

19 Claims, 7 Drawing Sheets

(56) References Cited

U.S. PATENT DOCUMENTS

| | | | |
|---|---|---|---|
| 2006/0108581 A1* | 5/2006 | Ahn et al. | 257/40 |
| 2008/0121869 A1* | 5/2008 | Wu et al. | 257/40 |
| 2009/0057656 A1 | 3/2009 | Matsubara et al. | |
| 2010/0078639 A1* | 4/2010 | Nomoto et al. | 257/57 |
| 2011/0121353 A1* | 5/2011 | Sheats et al. | 257/99 |
| 2011/0186829 A1* | 8/2011 | Burroughes et al. | 257/40 |

FOREIGN PATENT DOCUMENTS

| | | |
|---|---|---|
| WO | WO-2005/112146 A1 | 11/2005 |
| WO | WO-2010/015833 A1 | 2/2010 |

OTHER PUBLICATIONS

Arai et al., "Self-Aligned Fabrication Process of Electrode for Organic Thin-Film Transistors on Flexible Substrate Using Photosensitive Self-Assembled Monolayers," *Jap. J. Appl. Phys.*, 46:2700-2703 (2007).

Chabinyc et al., "Organic Polymeric Thin-Film Transistors Fabricated by Selective Dewetting," *App. Phys. Lett.*, 81(22):4260-4262 (2002).

Janssen et al., "Static Solvent Contact Angle Measurements, Surface Free Energy and Wettability Determination of Various Self-Assembled Monolayers on Silicon Dioxide," *Thin Solid Films*, 515(4):1433-1438 (2006).

Ke et al., "Facile Preparation of Superhydrophobic Biomimetic Surface Based on Octadecyltrichlorosilane and Silica Nanoparticles," *ACS Applied Materials & Interfaces*, 2(8):2393-2398 (2010).

Sele et al., "Lithography-Free, Self-Aligned Inkjet Printing with Sub-Hundred-Nanometer Resolution," *Adv. Mat.*, 17(8):997-1001 (2005).

International Preliminary Report on Patentability for Application No. PCT/GB2012/000646, dated Feb. 18, 2014.

International Search Report and Written Opinion for Application No. PCT/GB2012/000646, dated Jan. 10, 2013.

Search Report for Application No. GB1114215.5, dated Dec. 19, 2011.

\* cited by examiner

METHOD OF FABRICATING AN ELECTRONIC DEVICE COMPRISING ALLOWING A SELF-ASSEMBLED LAYER TO FORM SELECTIVELY

The present invention relates to an electronic device particularly, but not exclusively, to an organic thin-film transistor.

Organic thin-film transistors use semiconducting materials which may take the form of polymers, oligomers or small molecules. Such semiconducting materials may be soluble or insoluble in an organic solvent. In the case of soluble materials, organic solvents may be used to prepare a solution of the semiconducting material from which thin films of the material can be deposited onto device substrates for device fabrication. In the case of insoluble materials, thermal evaporation techniques can be used to obtain such thin films.

Early examples of thin-film transistors incorporating soluble organic semiconductor films exhibited poor charge carrier mobilities compared to those fabricated using inorganic materials, such as silicon. The early examples used amorphous polymers. Recent advances in the design of soluble organic semiconductors however have lead to significant improvements in the charge carrier mobility, most noticeably when using oligomers and small molecule materials. Mobility enhancement has been achieved through the development of crystalline materials and use of highly-ordered thin films. Such materials have lead to devices with comparable or even better mobility performance compared to those incorporating amorphous silicon. One advantage of these devices is that they can be fabricated using low-cost additive processing techniques, such as direct printing and solution processing, on large substrates. Thus, organic thin-film transistors are suited to being used in large area displays.

Thin-film transistors have three electrodes, typically formed from metals or highly-conductive polymers. In an ON state, when a bias is applied between source and drain electrodes, current flows between the two electrodes through a region known as the "channel" comprising a thin film of semiconductor material. The ON state is controlled by a gate electrode. The gate electrode is separated from the channel by a dielectric layer, i.e. an electrically-insulating layer. In the ON state, there is an accumulation of charge carriers at the interface between the channel and the dielectric layer and application of a source-drain bias causes charge carriers to flow between the source and drain electrodes.

Organic thin-film transistors can be configured such that the gate is formed under the channel in a so-called "bottom-gate" configuration, or over the channel, in a so-called "top-gate" configuration. In a transistor having a bottom-gate configuration, the gate is usually the first layer in the device to be deposited and is formed directly on the substrate.

In a transistor having a top-gate configuration, the source and drain electrodes defining the channel are deposited on a substrate, such as silicate glass, a semiconductor layer is deposited in the channel region, a dielectric layer is deposited on the semiconductor layer and a gate electrode is deposited on the dielectric layer over the channel region.

Currently, several different approaches are known to forming the source and drain electrodes on the substrate and depositing the semiconductor layer.

Referring to FIG. 1, in a first approach, metal source and drain electrodes 1, 2 are formed on a substrate 3 using photolithography. The electrodes 1, 2 can be defined by depositing a layer of metal, depositing and patterning a layer of positive photoresist to form a mask and then etching unmasked regions of the metal layer. Alternatively, the electrodes 1, 2 can be defined by depositing and patterning a layer of negative photoresist, depositing a layer of metal and lifting off unwanted regions of the metal in a process commonly known as "lift off". The semiconductor layer 4 is deposited over the electrodes 1, 2 and the substrate 3 between the electrodes 1, 2, for example, by printing or spin-coating.

This approach has the advantages that the source and drain electrodes are highly conductive. Also, it is possible to define short channel lengths and the process only uses one lithography step to define the source and drain electrodes. However, this approach has the disadvantage that there is a high contact resistance between the metal electrodes and the charge transport layer.

This problem may be solved by using non-metallic electrodes using solution processing.

Referring to FIG. 2, in a second approach, an insulating de-wetting strip 5 is formed on the substrate 3 and a conductive ink 6 is printed onto the substrate 3 to provide printed source and drain electrodes 7, 8. The de-wetting strip 5 repels the conductive ink 6 and helps to control the separation of the source and drain electrodes 7, 8. A charge-transport layer 4 is deposited over the electrodes 7, 8 and the substrate 3 between the electrodes 7, 8.

By using the de-wetting strip, it is possible to define short channel lengths. In common with the first approach, the second approach also only requires one lithographic step to define the source and drain electrodes. Moreover, it has the advantage of having lower contact resistances. However, this approach has the disadvantage that electrodes have a low conductivity, which is an issue for large area devices in that voltage drops will occur across addressing lines.

The problems of low conductivity and high contact resistance can be addressed by combining the first and second approaches.

Referring to FIG. 3, in a third approach, metal source and drain electrodes 1, 2 are formed on the substrate 3 using photolithography similar to the first approach. A de-wetting strip 5 is formed on the substrate 3 between the electrodes 1, 2 defined by photolithography. The electrodes 1, 2 are coated by a conductive ink 9 to provide charge injection layers 10, 11 before the charge transport layer 4 is deposited. This approach is described in U.S. Pat. No. 7,105,854 B.

The metal electrodes are highly conductive and the charge injection layers help to reduce contact resistance. Furthermore, this approach does not sacrifice resolution and so short channel lengths can still be realised. However, it suffers the drawback in that it requires two lithography steps, thereby increasing fabrication costs, and requires accurate alignment of the photomask for defining the de-wetting strip to the metal source and drain features defined in a preceding step. Furthermore, greater care needs to be taken during processing to clean and prepare surfaces for subsequent process steps. In particular, to form the de-wetting strip, material is spin-coated across the whole substrate including the electrodes. Therefore, it is important to ensure that unwanted regions of material are removed and the surfaces of the electrodes are clean prior to depositing the semiconductor material.

The need for photolithography can be avoided altogether.

Referring to FIG. 4, in a fourth approach, conductive inks 6', 6 are sequentially printed onto a substrate 3 to form first and second electrodes 7, 8. A first conductive ink 6' which is used to form the first electrode 7 contains a non-wetting surfactant which, when printed, migrates to the upper surface of the electrode 7 and repels a second ink 6 used to form the second electrode 8 and provides an insulating layer 12. This approach is described in more detail in U.S. Pat. No. 7,407,849 B and "Lithography-Free, Self-Aligned Inkjet Printing with Sub-Hundred-Nanometer Resolution", C. W. Sele et al., Advanced Materials, volume 17, number 8, page 997 (2005).

This approach has the advantages that it is possible to form short channel lengths without any photolithography steps and to achieve low contact resistances. However, similar to the second approach, it suffers the disadvantage that the electrodes have low conductivity.

Thus, the prior art approaches tend to suffer at least one significant drawback such as low resolution, low conductivity or high contact resistance or high number of processing steps.

It has been proposed to use self-assembled monolayer (SAM) material to help fabricate organic thin-film transistors, in particular, transistors having a bottom-gate configuration.

Self-assembled monolayer materials are generally used to decrease the surface energy of the substrate onto which the organic semiconductor is deposited. The surface is changed from being hydrophilic to hydrophobic. By lowering the surface energy of the substrate, the organic semiconductor can form a lamella structure or another patterned structure more uniformly than when materials are deposited on a higher surface energy substrate due to, for example, native polar groups present at the surface of silicon dioxide, i.e. glass. A lamella structure is observed for soluble semiconductors, such as poly 3-hexylthiophene (P3HT). Formation of a lamella structure leads to an improvement in pi-pi interactions between the neighbouring polymer chains or small molecules/oligomers, which in turn leads to an improvement in the field effect mobility of the transistor. In addition, the stacking direction of pi-pi "sheets" is tilted such that charge carriers can preferentially travel across the channel of the device. In other words, stacking is favoured in the horizontal axis rather than vertical orientation in line with the arrangement of the source and drain electrodes.

In these types of devices, the self-assembled monolayer is located at an interface between the dielectric and semiconductor layer.

An approach of self-aligned printing of source and drain electrodes to a gate electrode is disclosed in "Self-aligned fabrication process of electrode for organic thin-film transistors on flexible substrate using photosensitive self-assembled monolayers", Arai et al., Japanese Journal of Applied Physics, volume 46, pages 2700-2703 (2007). This approach is used to obtain minimal overlap of the source and drain electrodes to the gate using light-sensitive self-assembled monolayers exhibiting wetting contrast after light exposure and development. The source and drain electrodes are printed on a dielectric layer.

Self-assembled monolayers can be used in transistors having a top-gate configuration, for example, as described in WO 2010 015833 A, in which at least part of the surface of a channel region is treated to reduce its polarity before depositing a semiconductor layer in the channel.

The present invention seeks to provide an improved organic thin-film transistor or other similar electronic device.

According to the present invention there is provided a method of fabricating an electronic device, such as an organic thin-film transistor, the method comprising providing a substrate which supports at least one metallic electrode comprising at least one metal, wherein the at least one metallic electrode is patterned so as to expose at least a portion of the substrate, selectively forming a self-assembled layer on the exposed portion of the substrate such that no self-assembled layer is formed on the at least one metallic electrode and applying a solution or other liquid which is repelled by the self-assembled layer to at least one metallic electrode so as to selectively form a layer of further material on the at least one metallic electrode. Thus, no layer of further material is formed over the exposed portion of the substrate.

The at least one metallic electrode may be patterned in a process in which material is globally or unselectively deposited over a wide area and then patterned in a separate process (such as lithography and etching). The at least one metallic electrode may be patterned in a process in which material is selectively deposited (such as printing).

The substrate may have a surface which supports the at least one metallic electrode comprising at least one metal, wherein at least a portion of the surface of the substrate is exposed. All or a portion of the at least one metallic electrode may be exposed.

According to the present invention there is provided a method of fabricating an electronic device, such as an organic thin-film transistor, the method comprising providing a substrate which supports at least one metallic electrode comprising at least one metal, wherein the at least one metallic electrode is patterned so as to expose at least a portion of the substrate, selectively forming a self-assembled layer on the exposed portion of the substrate such that the at least one metallic electrode is substantially free of self-assembled layer material and applying a solution or other liquid which is repelled by the self-assembled layer to at least one metallic electrode so as to selectively form a layer of further material on the at least one metallic electrode. Thus, the exposed portion of the substrate is substantially free of the further material.

Thus, using only one lithographic step, metallic electrodes can be deposited and patterned and, using a self-aligned process, a solution processable material can be selectively formed on some or all of electrode(s). Another material can be subsequently deposited on the substrate. In the case of an organic thin-film transistor, this approach can be used to fabricate a device having highly-conductive metallic electrodes and, using a charge injection material as the further material, low contact resistance. The transistor can be made with a short channel length using only one electrode-defining lithography step.

The further material may comprise carrier injection promoting material or other material which reduces contact resistance of the at least one electrode.

The self-assembled layer may comprise a self-assembled monolayer. The self-assembled layer may comprise a polymer layer. The self-assembled layer may have a surface region which is hydrophobic and/or oleophillic.

The self-assembled layer may comprise an aryl-terminated polymer. The self-assembled layer may comprise an alkyl chain-terminated polymer.

The self-assembled layer may comprise a structure having at least one non-polar group such as linear, branched or cyclic alkyl and optionally substituted aryl end groups.

The self-assembled layer may comprise the structure:

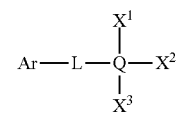

where Ar is an aryl group, L is a linker group or single bond, Q is silicon or germanium and where $X^1$ represents a bond to the surface of a substrate and $X^2$ and $X^3$ independently represent a bond to the surface of the substrate or a substituent group selected from the group: substituted or unsubstituted straight, branched or cyclic alkyl, alkenyl, alkynyl group having from 1 to 10 carbon atoms, linear or branched aryl group and fluorene group.

Both of $X^2$ and $X^3$ may represent bonds with the surface. The linker group L may comprise a substituted or un-substituted, straight, branched or cyclic alkyl group of 1 to 10 carbon atoms.

The self-assembled layer may comprise one or more of the structures:

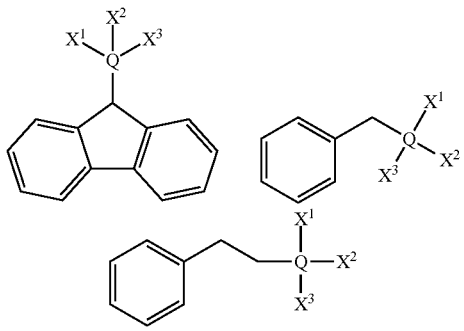

where Q is silicon or germanium, $X^1$ represents a bond to the surface of the substrate and $X^2$ and $X^3$, if present, independently represent a bond to the surface of the substrate or a substituent group selected from the group: substituted or unsubstituted straight, branched or cyclic alkyl or alkenyl group having from 1 to 10 carbon atoms, linear or branched aryl group and fluorene group.

The method may further comprise causing cross linking (i.e. of chains and/or groups) within the self-assembled layer. This may comprise heating the self-assembled layer above a cross linking temperature threshold and/or irradiating the self-assembled layer with radiation, for example ultraviolet radiation. Irradiation may be characterised in terms of an irradiance and exposure time.

Cross linking may be used, for example, to increase chemical resistance and/or thermal resistance of the self-assembled layer. The cross linking process preferably does not degrade the layer, for example, by substantially reducing surface energy contrast. For example, if heating is used, the temperature is preferably below a critical temperature, such as a temperature at which the layer decomposes or melts or changes in some other way which substantially impacts on its wetting properties.

The layer of further material may shift the effective work function of the at least one metallic electrode.

The solution or other liquid may have a first contact angle on the at least one electrodes and a second contact angle on the self-assembled layer, and the first and second contact angles may differ by at least 20°, at least 30° or at least 40°. The first contact angle may be no more than 40° or no more than 30°. The second contact angle may be at least 70° or at least 80°.

The method may further comprise providing a layer of organic semiconducting material over the layer of further material.

The organic semiconducting material may comprise a p-type organic semiconducting material having a highest occupied molecular orbital energy level and the further material may comprise a semiconducting material having an ionization potential between the highest occupied molecular orbital (HOMO) energy level of the p-type organic semiconducting material and the work function of the at least one metallic electrode. The organic semiconducting material may comprise an n-type organic semiconducting material having a lowest unoccupied molecular orbital (LUMO) energy level and the further material may comprise a semiconducting material having an LUMO energy level between the LUMO energy level of the n-type organic semiconducting material and the work function of the at least one metallic electrode.

The further material may comprise a doped semiconducting material. The further material may comprise an organic semiconducting material and may comprise a polymer, an oligomer or a small molecule material. The layer of further material may comprise poly(3,4-ethylenedioxythiophene) poly(styrenesulfonate), for example Clevios P®.

The organic semiconducting material may comprise a p-type organic semiconducting material having a highest occupied molecular orbital energy level and the further material may comprise a metallic material having a work function lying between the highest occupied molecular orbital energy level and the work function of the at least one metallic electrode. The organic semiconducting material may comprise an n-type organic semiconducting material having a lowest unoccupied molecular orbital energy level and the further material may comprise a metallic material having a work function lying between the lowest unoccupied molecular orbital energy level and the work function of the at least one metallic electrode. The metallic material may comprise a colloidal metal.

The further material may comprise a dopant for an organic semiconducting material and the method may further comprise providing a layer of the organic semiconducting material over the layer of dopant and forming a doped region in the organic semiconductor. The organic semiconducting material may comprise a p-type organic semiconducting material having a highest occupied molecular orbital energy level and the dopant may have a LUMO energy level lying above the highest occupied molecular orbital energy level of the p-type organic semiconducting material. The organic semiconducting material may comprise an n-type organic semiconducting material having a lowest unoccupied molecular orbital energy level and the dopant may have an ionization potential lying above the lowest unoccupied molecular orbital energy level of the n-type organic semiconducting material.

The layer may comprise a stack of two or more layers of material on the at least one electrode, each layer formed by applying a respective solutions to the at least one metal electrode, each solution being repelled by the self-assembled layer. The stack may include at least one layer of semiconducting material. The stack may comprise at least two layers of semiconducting material and the layers of semiconducting material are arranged in order of highest occupied molecular orbital energy level and/or lowest unoccupied molecular orbital level. The stack may include at least one layer of metallic material. The at least one layer of metallic material may be disposed between the at least one layer of semiconducting material and the at least one metal electrode. The stack may comprise at least two layers of metallic materials and the layers of metallic material may be arranged in order of work function such that the metallic material having the closest value of work function to that of the at least one electrode is placed closest to the at least one electrode. The stack may include at least one layer of dopant. A layer of dopant may be arranged at the top of stack adjacent to the layer of organic semiconducting material.

In order to minimise the contact resistance associated with the metal-semiconductor interface a number of approaches may be used. A material can be chosen which leads to a reduction of contact resistance of at least one of the device electrodes. Generally, the contact resistance may be reduced by using one or more of (but not limited to) the following approaches/materials, namely (i) use of a surface treatment for the metal in order to modify the work function, (ii) use of a solution processable material, which may be either a semiconductor or metal or (iii) use of a dopant material for the semiconductor in order to locally modulate the conductivity of the semiconductor in the region of the electrodes.

In the case examples below, a p-type only operation device is used as a working example, therefore the highest occupied molecular orbital energy level (HOMO energy level) relative to the metal work function is of primary importance. For an n-type only operation device the lowest unoccupied molecular orbital energy level (LUMO energy level) relative to the metal work function is of primary importance.

In case (i) example materials may be thiols or disulphides that have an affinity to adsorb on the metal surface (gold, silver, or copper for example) that then lead to the formation of a surface dipole at the metal. In the case of p-type semiconductor devices where the HOMO level of the semiconductor is larger than the work function of the native metal, the thiol material should contain species that are electron deficient (e.g. fluorine, nitro, cyano or hydroxyl group) and attached to groups that are either aromatic or non-aromatic. Upon adsorption to the metal, such surface dipoles have the effect of modulating the local vacuum level at the metal surface in order to lower the barrier for charge carrier injection from the metal to the semiconductor.

In case (ii) the approach for reducing the barrier for charge injection from the metal to the semiconductor is based on an intermediate HOMO energy level (for a semiconductor) or work function level (for a metal) to that of the work function of the metal and the HOMO energy level of the semiconductor. As such, either conductors or semiconductors may be selected for this purpose or a combination (preferably in a sequential manner) of the two. In the case of a conducting material, the work function of the material should be at an intermediate level to that of the metal and the HOMO level of the semiconductor. In the case of a semiconductor material, the HOMO level of this material should again be intermediate to the work function of the metal and the semiconductor. Furthermore, a doped semiconductor layer may also be used.

This approach also allows for more than one material to be deposited as the intermediate layer between the metal and semiconductor. This approach can be particularly advantageous when the energy barrier for charge carrier injection is large (>0.5 eV). In this case, the approach is to stagger materials with increasingly larger HOMO energy levels in order to produce a staggered sequence of materials with intermediate HOMO energy levels between the metal and semiconductor. In such an approach, the requirement for such semiconductor materials is that they may be formulated in a solvent that repels from the treated region of the device substrate. Solvent orthogonality can be used for this approach. The first material can use a cross-linking process in order to convert the material to an insoluble form before the next layer is deposited.

In case (ii) solution processable metals may also be used, such as a colloidal metal or a doped organic polymer (sometimes referred to as a "synthetic metal"). The material preferably has a work function that is intermediate to that of the work function of the metal electrode and the HOMO energy level of the semiconductor (for a p-type semiconductor) in order to produce a staggered sequence for charge carrier injection. Here, a combination of a metal layer followed by a semiconductor layer is possible in a similar manner as described above.

In case (iii) the approach for reducing contact resistance is to deposit a dopant material at the metal electrode in order to dope the semiconductor layer in the vicinity of the device electrodes. Here, organic and inorganic dopants may be selected. The purpose of the dopant is to produce a graded interface of doped semiconductor material at the electrodes such that the interface between metal and semiconductor is less discrete. In this case (again for a p-type device) the LUMO energy level of the dopant material should be equal to or greater than the HOMO energy level of the semiconductor. Such an arrangement allows for spontaneous charge transfer of electrons from the semiconductor to the dopant material, thus producing a p-doped semiconductor.

It may be advantageous to employ a combination of two or more of these approaches. For example, in a first step, one may localise a dopant material at the metal electrodes and then deposit a semiconductor layer in order to produce a further refinement to the graded dopant interface approach as described in case (iii).

The further material may comprise a thiol or disulfide.

The further material may present a negative dipole moment at the surface of the at least one electrode. The second layer of further material may comprise a halogenated or perhalogenated compound, for example, a fluorinated compound.

The further material may comprise a compound having at least one electron withdrawing group, preferably selected from the group consisting of nitro, cyano and hydroxyl.

The second layer may present a positive dipole moment at the surface of the electrode or electrodes, such as an alkane.

The further material may comprise the structure:

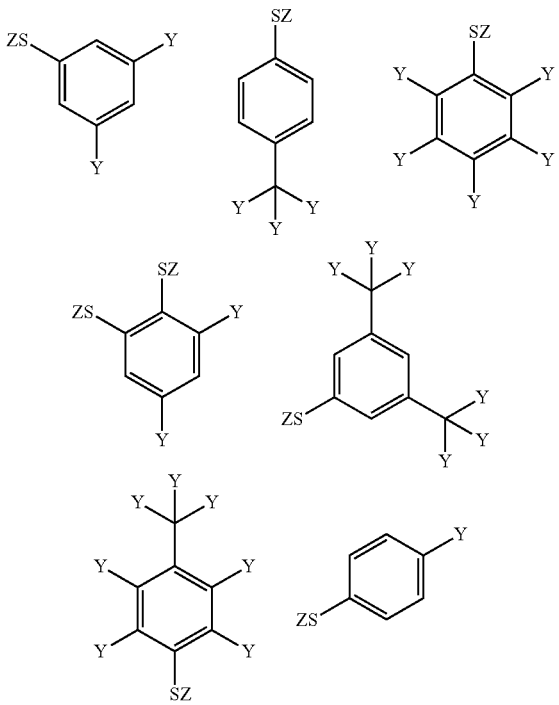

where Y represents an electron withdrawing group, preferably selected from the group consisting of nitro, cyano, hydroxyl and halogen, preferably fluorine, and Z represents a bond between the sulphur atom and the surface of the electrode.

Applying the solution or other liquid to the at least one metal electrode may comprise printing, for example ink jet printing, the solution onto the at least one metal electrode.

The electronic device may comprise at least two electrodes supported on the surface of the substrate and the solution may not be applied to at least one metal electrode. The method may further comprise applying another, different solution to at least one metal electrode.

The substrate may comprise an insulating material. The electronic device can be fabricated on a rigid or flexible substrate. Rigid substrates may be selected from glass or silicon and flexible substrates may comprise thin glass or plastics such as poly(ethylene-terephthalate) (PET), poly(ethylene-naphthalate) (PEN), polycarbonate and polyimide.

The metallic electrode may comprise a transition metal, such as copper. The metallic electrode may comprise a noble metal, such as gold or silver. Other highly-conductive metals, such as aluminium can be used. The metallic electrode may comprise a bi-layer comprising a relatively thin base layer comprising, for example chromium, titanium or other metal which promotes adhesion, and a relatively thick metal layer of a highly-conductive material, such as gold, disposed on the base layer. The metallic electrode may comprise an alloy of at least two metals.

The organic semiconductor material may be soluble or insoluble in a solvent. Soluble semiconductors may be made solution processable through the use of a suitable solvent. Exemplary solvents may include mono- or poly-alkylbenzenes, such as toluene, xylene, tri-methylbenzene and tetralin, alkoxybenzenes such as anisole, alkyl substituted alkoxybenzenes such asmethylanisole. Halogenated benzenes such as chlorobenzene, bromobenzene may also be used. Solution deposition techniques may include spin coating and inkjet printing. Other solution deposition techniques may include dip coating, roll printing and screen printing.

Preferred soluble organic semiconductors include functionalised acene core molecules, such as pentacene and pentacene derivatives, oliogmers based on acenes or fused thiophenes. Preferred fused thiophenes include thiophene fused to one or more further aryl groups, preferably one or more aryl groups selected from thiophene (e.g. to form dithiophene or dithienothiophene) and benzene. The organic semiconductor may optionally be substituted. Preferably, the organic semiconductor is substituted with a solubilising group such as alkyl, alkoxy or trialkylsilylethynyl. In one preferred embodiment, the organic semiconductor layer may be formed from a blend of materials, such as a small molecule and a polymer. Preferred insoluble materials may include acenes such as anthracene, tetracene, pentacene, a fused thiophene, or fused benzene-thiophene core material. Deposition methods may include techniques such as vacuum thermal evaporation or organic vapour phase deposition.

The organic semiconductor material may be soluble in water. The solvent may include a surface tension modifier.

The electronic device may comprise source and drain electrodes and the length of the channel defined between the source and drain electrodes may be up to 500 μm, but preferably the length is less than 200 μm, more preferably less than 100 μm, most preferably less than 20 μm.

The electronic device may include a gate electrode disposed on a gate dielectric layer which is in turn disposed on an organic semiconductor layer which runs between the source and drain electrodes. The gate electrode can be selected from a wide range of conducting materials, for example a metal (e.g. gold, aluminium, silver etc) or metal oxide ceramic compound (e.g. indium tin oxide). Alternatively, conductive polymers may be deposited as the gate electrode. Such conductive polymers may be deposited from solution, preferably using an additive process, such as ink jet printing or other solution deposition techniques.

A gate dielectric material may be selected from insulating materials having a high resistivity. The dielectric constant, k, of the dielectric is typically around 2-3 although materials with a high value of k are desirable because the capacitance that is achievable for an organic thin-film transistor is directly proportional to k, and the drain current, $I_D$, is directly proportional to the capacitance. Thus, in order to achieve high drain currents with low operational voltages, organic thin-film transistors with thin dielectric layers in the channel region are preferred.

The gate dielectric material may be organic or inorganic. Preferred inorganic materials include $SiO_2$, $SiN_x$ and spin-on-glass (SOG). Organic dielectric materials include fluorinated polymers such as polytetrafluoroethylene (PTFE). Other suitable fluorinated polymers that could have been used include perfluoro cyclo oxyaliphatic polymer (CYTOP), perfluoroalkoxy polymer resin (PFA), fluorinated ethylene-propylene (FEP), polyethylenetetrafluoroethylene (ETFE), polyvinylfluoride (PVF), polyethylenechlorotrifluoroethylene (ECTFE), polyvinylidene fluoride (PVDF), polychlorotrifluoroethylene (PCTFE), perfluoro elastomers (FFKM) such as Kalrez® or Tecnoflon®, fluoro elastomers such as Viton®, Perfluoropolyether (PFPE) and a polymer of tetrafluoroethylene, hexafluoropropylene and vinylidene fluoride (THV).

Fluorinated polymers can be an attractive choice for the dielectric material, particularly in the field of organic thin film transistors, because they tend to possess one or more favourable properties. For example, they tend to have excellent spin coating properties, for instance wetting on a wide variety of surfaces and forming films, with the option of doing multi-layer coatings. They tend to be chemically inert. They tend to exhibit quasi-total solvent orthogonality. Consequently, the risk of the organic semiconductor being dissolved by the solvent used for spin-coating the dielectric is minimised or reduced. Finally, such polymers also tend to have high hydrophobicity. This can be advantageous because it can result in low water uptake and low mobility of ionic contaminants in the fluorinated polymer dielectric, thereby resulting in low hysteresis.

Non-fluorinated organic polymer insulator materials may also be used and include polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents for example use of a solvent for deposition of the uppermost layer that does not dissolve the underlying layer; and cross linking of the underlying layer.

The thickness of the insulating layer is preferably less than 2 μm, more preferably less than 500 nm.

The method may further comprise providing a layer of organic semiconductor material over the substrate and the at least one electrode.

The electronic device may comprise two electrodes spaced apart so as to form a channel region therebetween and wherein the organic semiconductor material layer covers at least the channel region and at least overlaps onto the electrodes, forming a layer of dielectric material on the organic semiconductor material layer and forming a gate electrode on the dielectric material over the channel region.

According to a second aspect of the present invention there is provided an electronic device fabricated according to the method.

According to a third aspect of the present invention there is provided an electronic device, such an organic thin-film transistor, comprising a substrate which supports at least one metallic electrode which comprises at least one metal, wherein the at least one metallic electrode is patterned such that at least a portion of the substrate is exposed, a self-assembled layer disposed on the substrate, wherein the surface of the at least one metallic electrode is free of material forming the self-assembled layer and a layer of a solution-processable material disposed on at least one of the at least one metallic electrodes, wherein the self-assembled layer is free of a layer of the solution-processable material or free at least in the vicinity of the at least one of the at least one metallic electrodes.

Herein, the term "solution-processable material" is intended to cover a material which can be carried (e.g. suspended, mixed etc) in a liquid but which does not form a solution and yet the material-carrying liquid can be handled, applied or processed in the same or similar way to a solution, for example, by being able to be printed.

Embodiments of the present invention will now be described, by way of example, with reference to FIG. 5 and FIGS. 6a to 6q of the accompanying drawings, in which.

Figure 1:
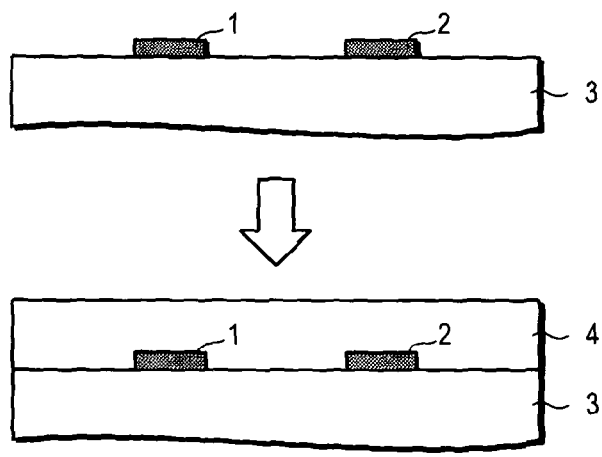
FIG. 1 illustrates a first method of forming electrodes on a substrate and subsequently forming an organic semiconductor layer between the electrodes.
Figure 2:
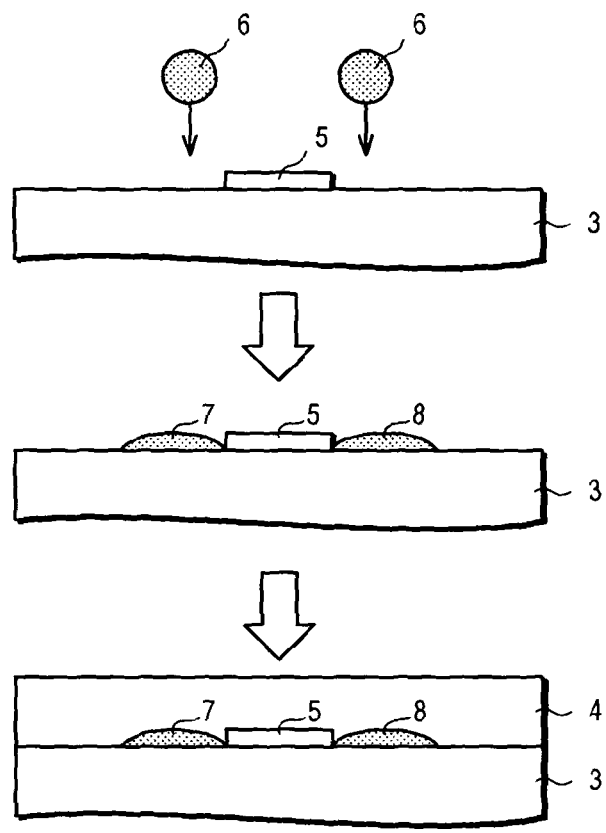
FIG. 2 illustrates a second method of forming electrodes on a substrate and subsequently forming an organic semiconductor layer between the electrodes.
Figure 3:
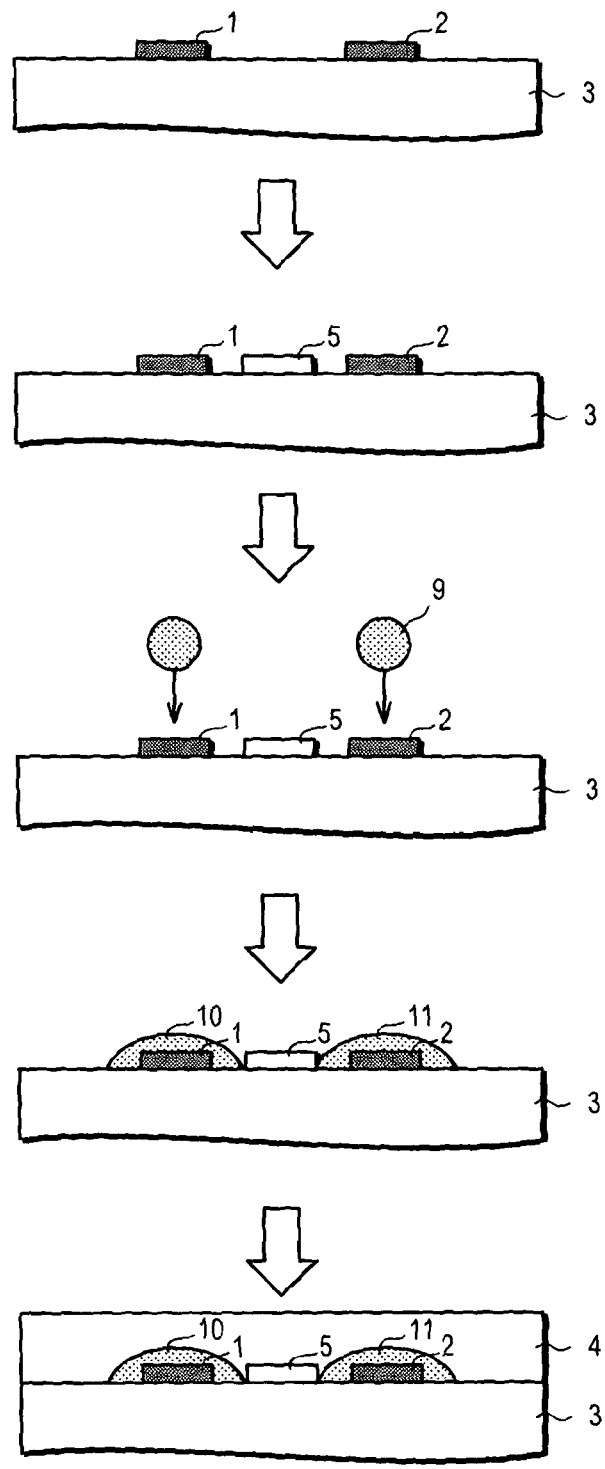
FIG. 3 illustrates a third method of forming electrodes on a substrate and subsequently forming an organic semiconductor layer between the electrodes.
Figure 4:
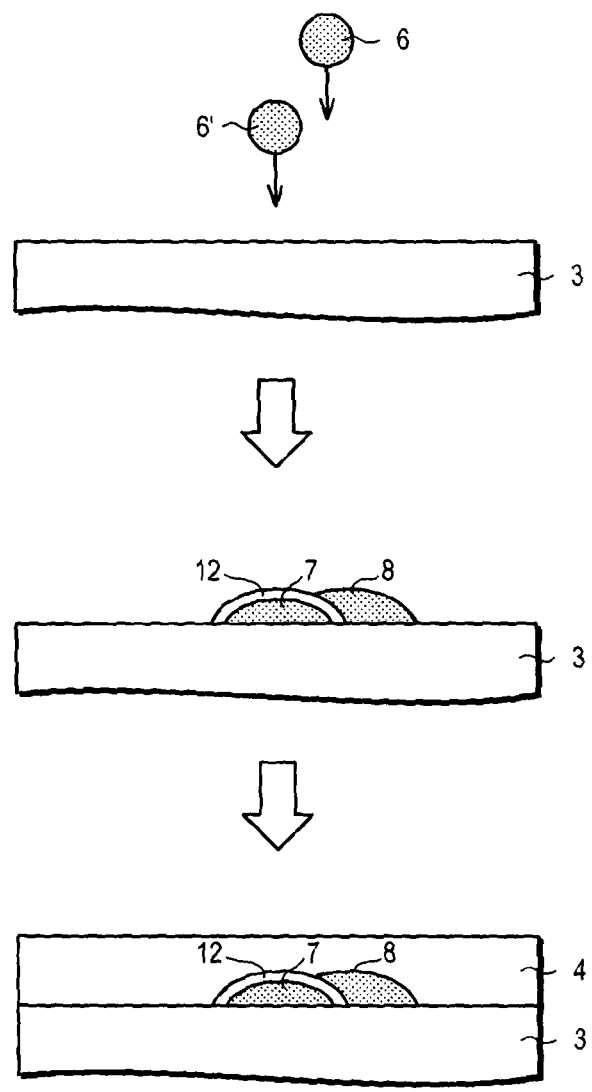
FIG. 4 illustrates a fourth method of forming electrodes on a substrate and subsequently forming an organic semiconductor layer between the electrodes.
Figure 5:
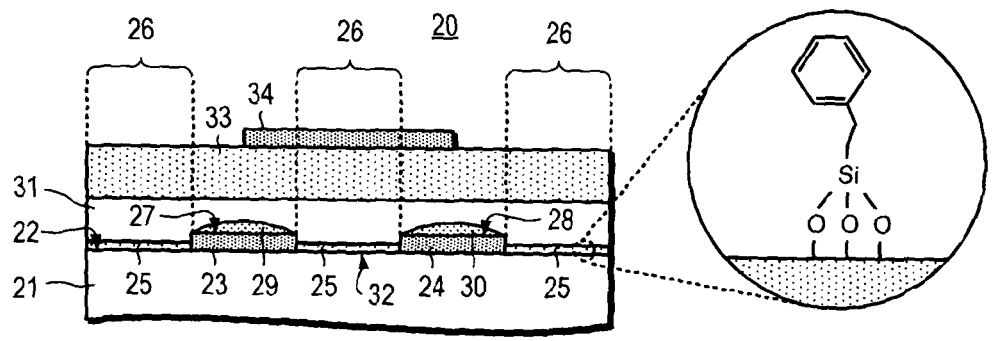
Figure 6:
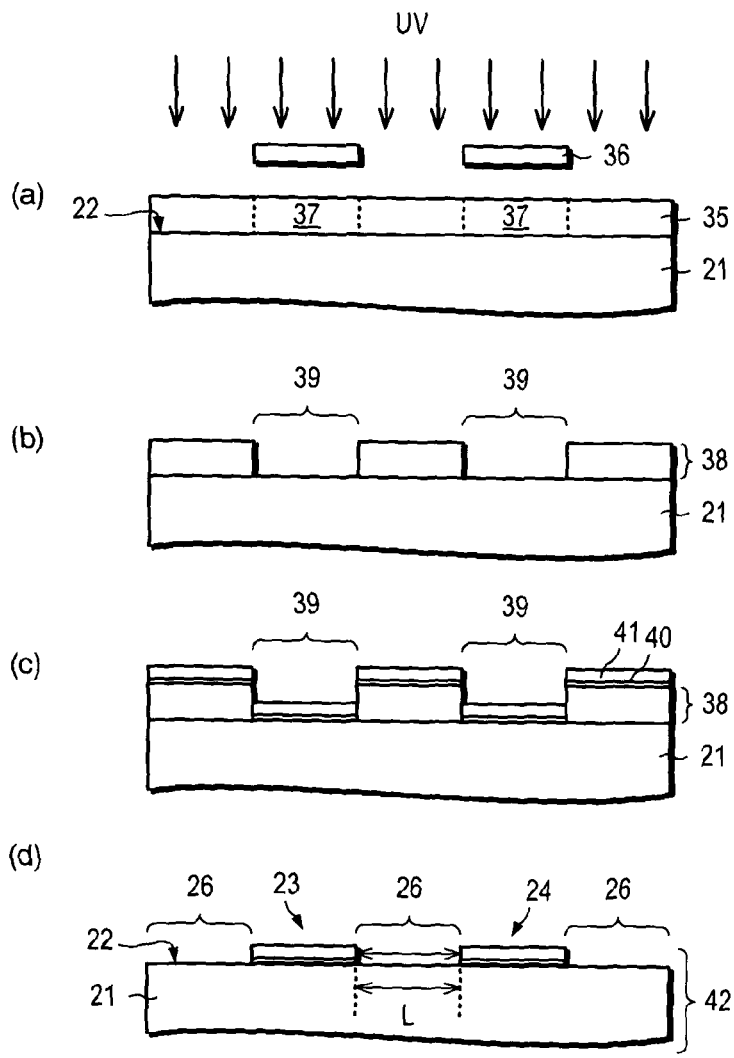
Figure 6:
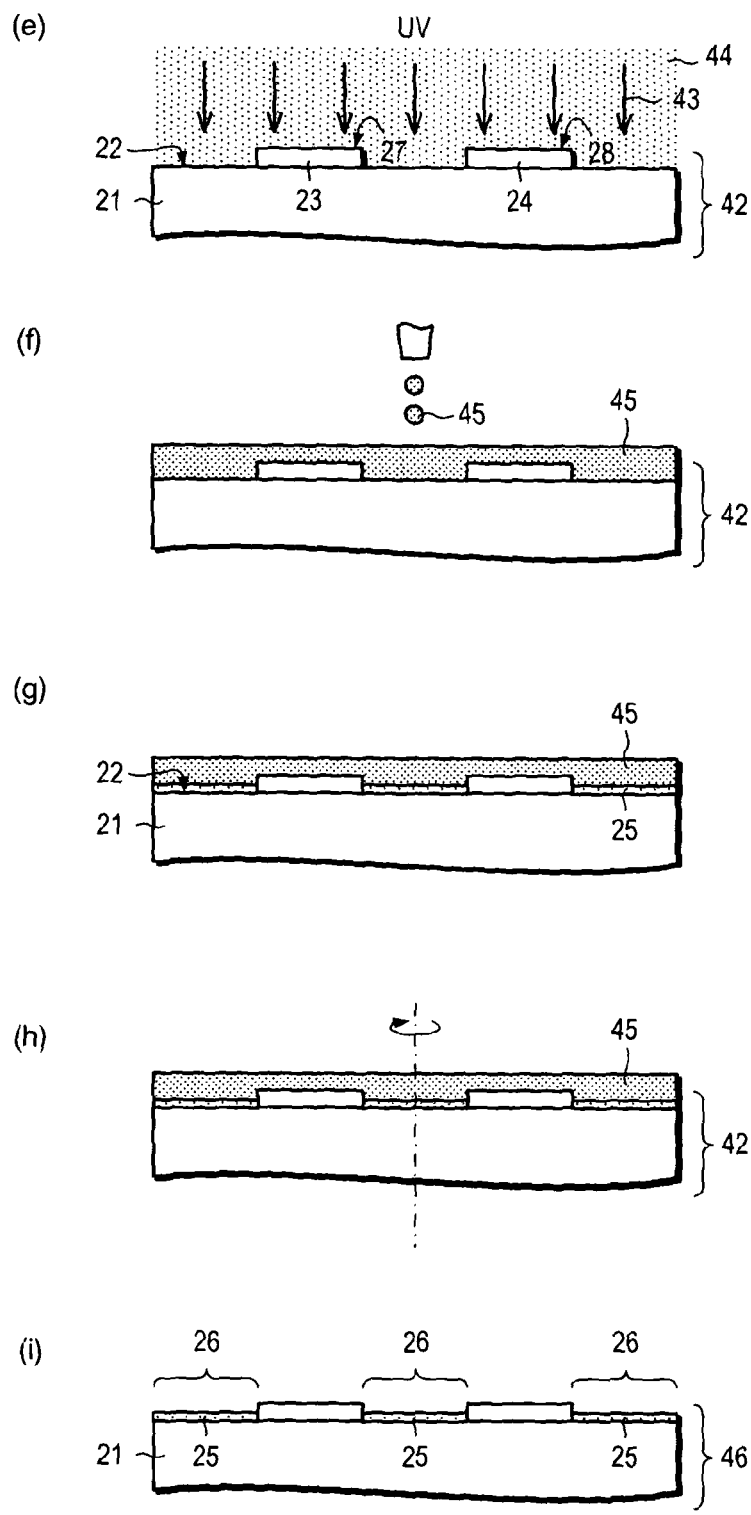
Figure 6:
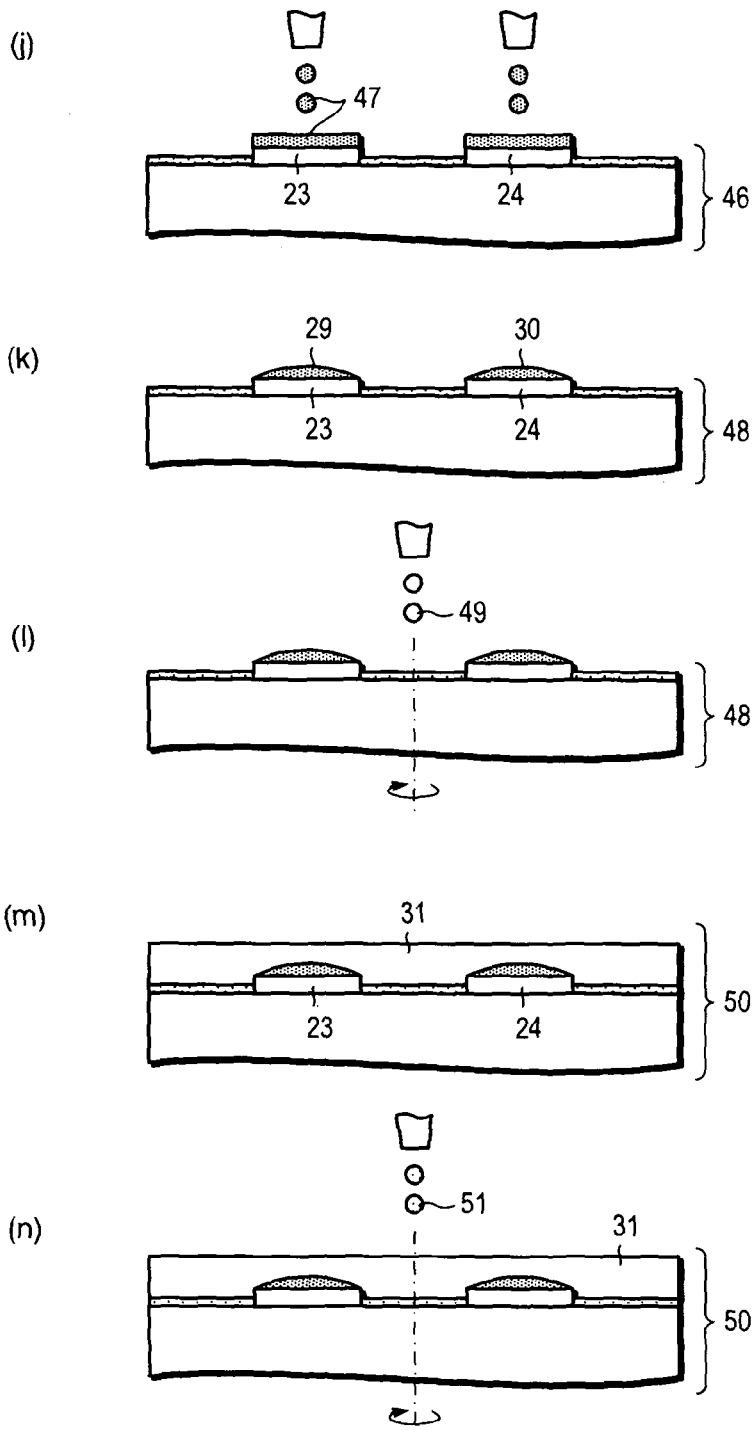
Figure 6:
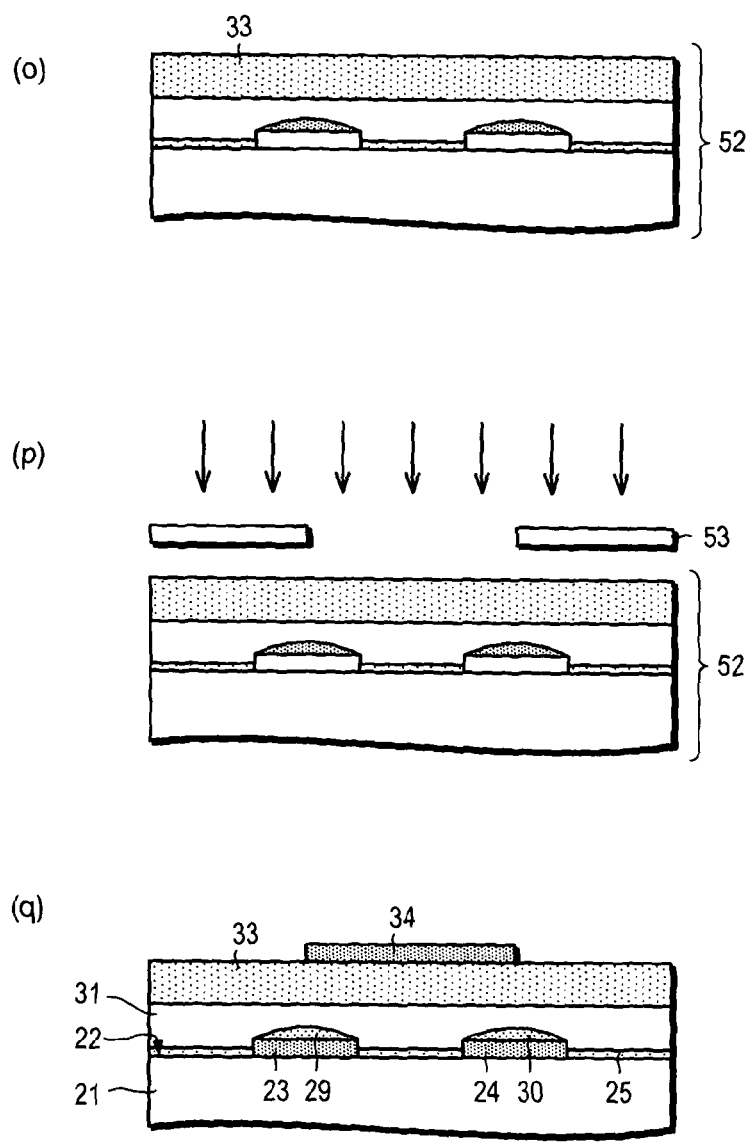

FIG. 5 schematically illustrates an organic thin-film transistor in accordance with the present invention; and FIGS. 6a to 6q illustrates stages during manufacture of the transistor shown in FIG. 5.

DEVICE STRUCTURE

Referring to FIG. 5, a top-gate organic thin film transistor 20 in accordance with the present invention is shown. The transistor 20 includes a planar substrate 21 formed from glass, for example a silicate glass, plastic or spin-on glass, having a surface 22. The transistor 20 is shown in FIG. 5 in a typical orientation with the surface 22 facing upwards.

The substrate 21 directly supports metal source and drain electrodes 23, 24 on the surface 22 of the substrate 21. The source and drain electrodes 23, 24 each comprise a relatively thin (e.g. 5 nm) base layer of chromium (Cr) which is used to promote adhesion to the substrate 21 and a relatively thick (e.g. 40 nm) layer of gold (Au) (not shown).

The substrate 21 also directly supports a thin self-assembled layer 25 on the surface 22 of the substrate 21 in regions 26 not covered by the source and drain electrodes 23, 24. In this example, the self-assembled layer 25 comprises a phenyl-terminated self-assembled monolayer.

The source and drain electrodes 23, 24 support, on respective upper surfaces 27, 28, layers 29, 30 of charge injection material. In this example, the charge injection material comprises Clevios P® material. The charge injection layers 29, 30 help improve charge injection from the electrodes 23, 24 into an organic semiconductor material 31 in order to reduce contact resistance. By a process which will be explained in more detail later, the charge injection material does not cover the substrate 25 in the regions 26 not covered by the electrodes 23, 24 or at least parts of the region 26 in between and/or in the vicinity of the source and drain electrodes 23, 24.

A layer 31 of organic semiconductor covers the self-assembled layer 25 and the charge injection layers 29, 30. The semiconductor layer 31 comprises 6,13-bis(triisopropylsilylethynyl) (TIPS) pentacene and has a thickness in the range between about 20 nm and 100 nm.

The source and drain electrodes 23, 24 define a channel region 32 between the electrodes 23, 24. The semiconductor layer 31 lies in the channel region 32 on the self-assembled layer 25.

A layer 33 of organic dielectric material lies on the organic semiconductor layer 31 and a metal gate electrode 34 is arranged on the dielectric layer 32. The gate electrode 34 comprises a relatively thin (e.g. 5 nm) base layer and a relatively thick (50 nm) layer of aluminium.

Device Fabrication

Referring to FIGS. 6a to 6q, a method of fabricating the organic thin film transistor 20 shown in FIG. 5 will now be described.

Referring to FIG. 6a, a layer 35 of negative photoresist is deposited onto the surface 22 of the substrate 21, e.g. by spin coating. The layer 35 is exposed through a mask 36 and is developed so to remove un-exposed regions 37 of resist.

FIG. 6b shows the resulting patterned photoresist layer 38. As shown in FIG. 6b, windows 39 are formed in the patterned photoresist layer 38 corresponding to the pattern of the source and drain electrodes 23, 24 (FIG. 5).

Referring to FIG. 6c, a thin layer 40 of chromium (Cr) followed by a layer 41 of gold (Au) are deposited by thermal evaporation over the patterned photoresist layer 38. In this example, the chromium layer 40 has a thickness of about 5 nm and the gold layer 41 has a thickness of about 40 nm. As shown in FIG. 6c, the metal bi-layer 40, 41 sits directly on the substrate 21 inside the windows 39 in the photoresist.

The patterned photoresist layer 38 and unwanted regions of the metal bi-layer 40, 41 are lifted off in a solvent.

FIG. 6d shows a patterned substrate 42 comprising source and drain electrodes 23, 24 in contact with the surface 22 of the substrate 21. This leaves exposed regions 26 of the substrate 22 which are not covered by the electrodes 23, 24.

As shown in FIG. 6d, the source and drain electrodes 23, 24 are separated by a gap of between about 5 μm and about 200 μm which defines the channel length, L. In some example, the channel length may be less than 5 μm. The electrodes 23, 24 run parallel to each other (out of the page) for a distance of about 2 mm which defines the channel width, W (not shown). To aid clarity, the layers in the metal bi-layer 40, 41 are not shown in FIGS. 6e to 6q hereinafter.

Referring to FIG. 6e, the patterned substrate 42 is cleaned by exposure to UV light 43 in an ozone atmosphere 44 for a duration of about 10 minutes. Alternatively exposure to an oxygen plasma may be used. This step is used to remove or decompose organic contaminants (not shown) present on the surface 22 of the substrate 21 and surfaces 27, 28 of the electrodes 23, 24. By decomposing organic contaminants, the native surface of the glass regions, including polar groups such as OH⁻ groups, will be exposed which render the substrate surface 22 hydrophilic. In addition to exposing the native surface, the UV/ozone step may convert any decomposed organic contaminants into carbon-containing hydroxyl and carboxylic acid (—COOH) groups. Oxygen plasma exposure tends to be more efficient at removing such organic contaminants.

Pre-treatment of the channel region 32 (FIG. 5) is carried out using solution processing techniques similar those used for depositing organic semiconductor and dielectric layers.

A solution 45 (FIG. 6f) of phenyl-terminated tricholosilane is prepared by adding phenethyltrichlorosilane material to toluene to a concentration of 100 mM and agitating the solution to ensure a homogenous solution is obtained.

Referring to FIG. 6f, the solution 45 is dispensed onto the patterned substrate 42 through a 0.45 μm filter (not shown) to cover the patterned substrate 42 completely.

Referring to FIG. 6g, the solution 45 is left for a period of 2 minutes to ensure a sufficiently dense self-assembled monolayer 25 condenses on the surface 22 of the substrate 21, particularly on the substrate 21 in the channel region 34.

Without wishing to be bound by any particular theory, it is postulated that metal electrodes, such as gold, retain their original surface energy and therefore wetting properties, in contrast to the hydrophobic substrate surface. Provided that the surface energy contrast is sufficiently high, a water-based charge injection layer solution can be deposited such that the charge injection material wets the electrodes only, maintaining the dimensions of the channel as determined by the metal electrodes.

Referring to FIG. 6h, the solution 45 is removed by spinning the substrate 42 at 1000 rpm for a period of 30 seconds in a spin-coating machine (not shown).

FIG. 6i shows the resulting coated, patterned substrate 46 in which exposed regions 26 of the underlying substrate 21 are covered by a self-assembled layer 25.

The coated, patterned substrate 46 is rinsed with the host solvent, toluene (not shown) to remove hydrochloric acid (HCl) produced during condensation. The solvent (not shown) is dispensed through a 0.45 μm filter (not shown). The solvent (not shown) is left on the coated, patterned substrate 46 for a period of 5 seconds before spinning. Further toluene (10 ml) is dispensed across the coated, patterned substrate 46 throughout a spin coating cycle at 1000 rpm for 30 seconds. This completes pre-treatment step.

A solution 47 (FIG. 6j) is prepared by diluting Clevios P® VP Al 4083 in de-ionised water in a volume ratio of 1:1.

Referring to FIG. 6j, the charge-injection material containing solution 47 is selectively dispensed onto the source and drain electrodes 23, 24, for example by inkjet printing or pipetting. Some solution 47 may be dispensed onto the self-assembled layer 25, for instance because the solution cannot be dispensed with sufficient resolution. However, the solution 47 is repelled by the hydrophobic self-assembled layer 25.

The solution 47 has a contact angle similar to water of about 33° on the electrodes 23, 24 and about 80° on the self-assembled layer 25. Due to the large contact angle contrast for water (about 45°), the solution 47 is confined to the source and drain electrodes 23, 24 and does not spill over onto or at least does not form a continuous layer on the self-assembled layer 25. The film is dried in a dry nitrogen atmosphere at 100° C. for 5 minutes to drive off host solvent.

FIG. 6k shows the resulting coated, patterned substrate 48 comprising electrodes 23, 24 coated with Clevios P®.

Referring to FIG. 6l, a solution 49 containing 6,13-bis (triisopropylsilylethnyl) (TIPS) pentacene in tetralin solvent is applied by spin coating at 1000 rpm for 60 seconds. The solution comprises 20 mg of solid per 1 ml of solvent. The film is dried in a dry nitrogen atmosphere at 100° C. for 5 minutes to remove host solvent.

FIG. 6m shows the resulting semiconductor-coated, patterned substrate 50. As explained earlier, the organic semiconductor layer 31 has a thickness lying in a range between about 20 nm and about 100 nm.

Referring to FIG. 6n, a solution 51 of PTFE is applied over the organic semiconductor layer 31 by spin coating at 1000 rpm for 60 seconds. In this example, the solution 51 contains 20 mg of solid per 1 ml of solvent. The dielectric is then dried at 80° C. for 10 minutes.

FIG. 6o shows the resulting dielectric-coated, patterned substrate 52. The dielectric layer 33 has a thickness typically of about 250 nm.

Referring to FIGS. 6p and 6q, the gate electrode 34 is formed by evaporating a bi-layer of chromium (5 nm) and aluminium (>50 nm) using a shadow mask 53 onto the dielectric layer 33.

As explained earlier, the use of a solution-repelling self-assembled layer allows deposition of a water-based material to be confined such that the material only wets the electrodes, thereby maintaining the dimensions of the channel as determined by the electrodes. This can benefit organic thin-film transistors, as well as other similar types of devices, for example, having electrodes deposited on a substrate.

Alternative Self-Assembled Monolayer Materials

In the example hereinbefore described, a self-assembled monolayer is formed using phenethyltrichlorosilane. However, other self-assembled monolayer materials can be used, for example when using gold electrodes.

For polymer semiconductors, alkyl chain terminated self-assembled monolayer materials can be used without causing the semiconductor to reticulate from the surface. Such self-assembled monolayer materials can have a mono-, di- or tri-chlorosilane anchoring group to graft to a glass surface and can have an alkyl chain as a terminating group. A naphthalene terminating group can also be used.

Different alkyl chain spacer lengths can be used if either a phenyl or naphthalene terminating group is used. For example, alkyl chain lengths from 1 to 18 carbon units can be used.

Other terminating groups may include those based on, but not limited, to fluorene, naphthylmethyl, cyclochexyl, dicyclohexyl species.

Alternative Charge Injection Materials

In the example hereinbefore described, a Clevios P® material is used to improve the charge injection from a metal contact into a semiconductor. However, other charge injection materials can be used.

For example, fluorinated benzenethiols may be used to create a net negative dipole moment at the surface of a metal, such as gold, silver or copper. Such materials are typically prepared in non-aqueous solvents. The non-aqueous solvent may be an alcohol, for example 2-propanol, or a glycol, such as ethylene glycol.

Polyaniline based materials may be used, which are available from Panipol Oy, Finland.

Preferably, a charge injection material solution is formulated to have a high surface tension (e.g. above 35 mN/m at 20° C.) to help confine the solution to the electrode regions of the device.

The source and drain electrodes may be configured so as to have asymmetric charge injection properties. For example, the charge injection material can be deposited on one, but not the other of the two electrodes. For example, the charge injection material can be selectively applied to the source electrode, but not the drain electrode using, for example, inkjet printing, to reduce the barrier height for charge injection. Typically, the work function of a metal contact is lower than the HOMO level of the semiconductor, thus resulting in a barrier at the source side of the device. Alternatively, different materials can be deposited over different electrodes, for example using inkjet printing.

Alternative Electrode Materials and Alternative Self-Assembled Monolayer Materials In the example hereinbefore described, gold is used as an electrode material. Gold is preferred when using a trichlorosilane anchoring group because it has a low reactivity. Thus, the metal electrode is not damaged when exposed the self-assembled monolayer solution.

Materials other gold, such as copper and silver, can be used particularly if a less reactive anchoring group is used, such as methoxysilane which provides an anchor to glass.

Other Functional Materials

In the examples hereinbefore described earlier, charge injection material is selectively deposited on metal electrodes. However, the approach can be applied to high-resolution patterning of printable features, such as the inkjet printing of metal colloids, and other solution-processable functional materials.

For example, metal nano-particles functionalised with organic ligands to permit dispersion in polar solvents can be printed using the approach described earlier. This approach could be particularly useful if an array of different colloidal materials is to be printed on one substrate in the same plane of a device. In a first step, a layer of metal can be deposited and patterned as described earlier, i.e. using photolithography, thermal evaporation and lift off to define areas that require the printed colloidal material. A self-assembled monolayer is formed on the substrate. A layer of colloidal material can then be deposited, for example by inkjet printing, on or along these metal features to selectively attain the required pattern of colloidal materials. The functional group on the colloidal particles is chosen to be of the same species to permit the formation of an appropriate dispersion in a common solvent.

Other Modifications

It will be appreciated that further modifications may be made to the embodiments hereinbefore described.

For example, the electrodes can be deposited in other ways, e.g. by sputtering or printing.

The electronic device need not be a top-gate organic thin film transistor, but can be a bottom-gate organic thin film transistor.

The electronic device need not be a thin-film transistor. The electronic device can be any other form of devices in which a solution-processable material can be locally deposited in a vertical (or stacked) configuration on a metal layer, such as a light emitting diode, photovoltaic cell, capacitor (for example, a ferroelectric capacitor) or diode.

For example, the device may be an organic diode which incorporates a metal layer, such as a thin (<20 nm) layer of gold, onto which Clevios P® is deposited. Gold is used as a replacement for indium tin oxide (ITO) layer since if indium tin oxide is used then the self-assembled layer may condense on the anode in addition to the glass, therefore resulting in little or no surface energy contrast.

The invention claimed is:

1. A method of fabricating an electronic device, the method comprising:

providing a substrate which supports at least one metallic electrode comprising at least one metal, wherein the electrode is patterned to expose at least a portion of the substrate;

depositing a solution of a self-assembled monolayer precursor material on the patterned substrate to cover it completely;

allowing a self-assembled layer to form selectively on the substrate but not on the at least one metallic electrode;

removing the solution from the areas where the self-assembled layer has not formed; and applying a solution or other liquid which is repelled by the self-assembled layer to at least one metallic electrode so as to selectively form a layer of further material on the at least one metallic electrode and not on the self-assembled layer.

2. A method according to claim 1, wherein the further material comprises a carrier injection promoting material.

3. A method according to claim 1, wherein the self-assembled layer comprises a self-assembled monolayer.

4. A method according to claim 1, wherein the self-assembled layer comprises the structure:

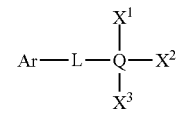

where Ar is an aryl group, L is a linker group or single bond, Q is silicon or germanium and where $X^1$ represents a bond to a surface of the substrate and $X^2$ and $X^3$ independently represent a bond to the surface of the substrate or a substituent group selected from the group consisting of: substituted or unsubstituted straight, branched or cyclic alkyl, alkenyl, alkynyl groups having from 1 to 10 carbon atoms, linear or branched aryl groups and fluorene groups.

5. A method according to claim 1 wherein the self-assembled layer comprises one or more of the structures:

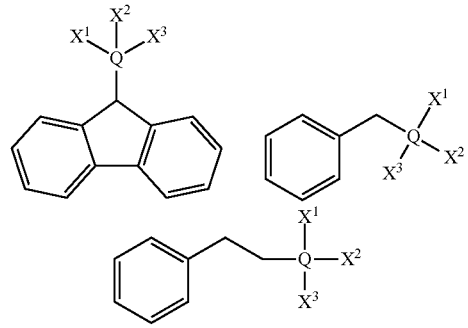

where Q is silicon or germanium, $X^1$ represents a bond to the surface of the substrate and $X^2$ and $X^3$, if present, independently represent a bond to the surface of the substrate or a substituent group selected from the group consisting of: substituted or unsubstituted straight, branched or cyclic alkyl or alkenyl groups having from 1 to 10 carbon atoms, linear or branched aryl groups and fluorene groups.

6. A method according to claim 1, further comprising: causing cross-linking within the self-assembled layer.

7. A method according to claim 1, wherein the method further comprises:
providing a layer of organic semiconducting material over the layer of further material.

8. A method according to claim 7, wherein the organic semiconducting material comprises a p-type organic semiconducting material having a highest occupied molecular orbital energy level and the further material comprises a semiconducting material having an ionization potential between the highest occupied molecular orbital energy level of the p-type organic semiconducting material and the work function of the at least one metallic electrode.

9. A method according to claim 7, wherein the organic semiconducting material comprises an n-type organic semiconducting material having a lowest unoccupied molecular orbital energy level and the further material comprises a semiconducting material having a lowest unoccupied molecular orbital energy level between the lowest unoccupied molecular orbital energy level of the n-type organic semiconducting material and the work function of the at least one metallic electrode.

10. A method according to claim 8, wherein the further material comprises a doped semiconducting material.

11. A method according to claim 1, wherein the further material comprises poly(3,4-ethylenedioxythiophene)poly(styrenesulfonate).

12. A method according to claim 7, wherein the organic semiconducting material comprises a p-type organic semiconducting material having a highest occupied molecular orbital energy level and the further material comprises a metallic material having a work function lying between the highest occupied molecular orbital energy level and the work function of the at least one metallic electrode.

13. A method according to claim 7, wherein the organic semiconducting material comprises an n-type organic semiconducting material having a lowest unoccupied molecular orbital energy level and the further material comprises a metallic material having a work function lying between the lowest unoccupied molecular orbital energy level and the work function of the at least one metallic electrode.

14. A method according to claim 1, wherein the further material comprises a dopant for an organic semiconducting material and the method further comprises:
providing a layer of the organic semiconducting material over the layer of dopant; and
forming a doped region in the organic semiconductor.

15. A method according to claim 14, wherein the organic semiconducting material comprises a p-type organic semiconducting material having a highest occupied molecular orbital energy level and the dopant has a lowest unoccupied molecular orbital energy level lying above the highest occupied molecular orbital energy level of the p-type organic semiconducting material.

16. A method according to claim 14, wherein the organic semiconducting material comprises an n-type organic semiconducting material having a lowest unoccupied molecular orbital energy level and the dopant has an ionization potential lying above the lowest unoccupied molecular orbital energy level of the n-type organic semiconducting material.

17. A method according to claim 1, wherein the electronic device comprises at least two electrodes supported on the substrate and wherein the solution is not applied to at least one metal electrode.

18. A method according to claim 17, further comprising applying another, different solution to at least one metal electrode.

19. A method according to claim 14, wherein the device comprises two electrodes spaced apart so as to form a channel region therebetween and wherein the organic semiconductor material layer covers at least the channel region and at least overlaps the two electrodes; the method further comprising:
forming a layer of dielectric material on the organic semiconductor material layer; and
forming a gate electrode on the dielectric material over the channel region.

* * * * *